(12) United States Patent
Corum et al.

(10) Patent No.: US 9,880,243 B2
(45) Date of Patent: Jan. 30, 2018

(54) SIDEBAND PROCESSING FOR MAGNETIC RESONANCE

(75) Inventors: Curtis A. Corum, Shoreview, MN (US); Steen Moeller, Golden Valley, MN (US); Djaudat S. Idiyatullin, New Brighton, MN (US); Ryan Chamberlain, Maplewood, MN (US); Michael G. Garwood, Medina, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 890 days.

(21) Appl. No.: 13/527,283

(22) Filed: Jun. 19, 2012

(65) Prior Publication Data

US 2013/0043867 A1 Feb. 21, 2013

Related U.S. Application Data

(60) Provisional application No. 61/499,015, filed on Jun. 20, 2011.

(51) Int. Cl.
*G01R 33/54* (2006.01)
*G01R 33/56* (2006.01)
*G01R 33/46* (2006.01)

(52) U.S. Cl.
CPC ................ *G01R 33/4616* (2013.01)

(58) Field of Classification Search
CPC .. G01R 33/54; G01R 33/565; G01R 33/4616; G01R 33/56
USPC .................................................. 324/300–322
See application file for complete search history.

(56) References Cited

U.S. PATENT DOCUMENTS

| 3,531,715 A | 9/1970 | Watson |
| 4,438,400 A | 3/1984 | Patt |
| 4,556,847 A | 12/1985 | Aspiotis et al. |
| 4,700,138 A | 10/1987 | Shimazaki et al. |
| 4,742,301 A | 5/1988 | Van Der Meulen et al. |
| 5,140,268 A | 8/1992 | Chan |
| 5,457,385 A | 10/1995 | Sydney et al. |
| 6,366,872 B1 | 4/2002 | Fetler |

(Continued)

FOREIGN PATENT DOCUMENTS

| JP | 08-164119 A | 6/1996 |
| JP | 2003-512862 A | 4/2003 |

(Continued)

OTHER PUBLICATIONS

"U.S. Appl. No. 12/752,668, Non Final Office Action dated Aug. 7, 2012", 6 pgs.

(Continued)

*Primary Examiner* — Melissa Koval
*Assistant Examiner* — Rishi Patel
(74) *Attorney, Agent, or Firm* — Schwegman Lundberg & Woessner, P.A.

(57) ABSTRACT

A method includes applying a pulse train to a spin system in a scanner. The pulse train has a plurality of discontinuities in a time domain. The method includes receiving a response from the spin system. The response corresponds to a gated signal. The method includes accessing a correction factor corresponding to the scanner. The method includes calculating a correction to the response based on the correction factor. The method includes generating an output based on the correction.

5 Claims, 15 Drawing Sheets

(56) References Cited

U.S. PATENT DOCUMENTS

| | | | |
|---|---|---|---|
| 7,403,006 | B2 | 7/2008 | Garwood et al. |
| 7,425,828 | B2 | 9/2008 | Garwood et al. |
| 7,777,484 | B2 | 8/2010 | Garwood et al. |
| 7,834,625 | B2 | 11/2010 | Doyle et al. |
| 8,067,936 | B2 | 11/2011 | Garwood et al. |
| 8,184,879 | B2 * | 5/2012 | Geier et al. .................. 382/128 |
| 8,432,165 | B2 * | 4/2013 | Weiger Senften et al. ... 324/307 |
| 8,519,707 | B2 | 8/2013 | Corum et al. |
| 8,933,698 | B2 | 1/2015 | Corum et al. |
| 2009/0257634 | A1 * | 10/2009 | Moeller ............. G01R 33/5659 382/131 |
| 2010/0253341 | A1 | 10/2010 | Corum et al. |
| 2011/0092797 | A1 | 4/2011 | Wang et al. |
| 2011/0137148 | A1 | 6/2011 | Khizhnichenko |
| 2013/0320980 | A1 | 12/2013 | Corum et al. |

FOREIGN PATENT DOCUMENTS

| | | |
|---|---|---|
| JP | 2004-344266 A | 12/2004 |
| JP | 2009-82178 A | 4/2009 |
| JP | 2011-72652 A | 4/2011 |
| WO | WO-2009/126285 A1 | 10/2009 |
| WO | WO-2010/114608 A1 | 10/2010 |
| WO | WO-2010/114609 A1 | 10/2010 |
| WO | WO-2011/123567 A1 | 10/2011 |

OTHER PUBLICATIONS

"U.S. Appl. No. 12/752,668, Notice of Allowance dated Apr. 30, 2013", 6 pgs.

"U.S. Appl. No. 12/752,668, Response filed Nov. 12, 2012 to Non Final Office Action dated Aug. 7, 2012", 7 pgs.

"U.S. Appl. No. 13/961,042, Non Final Office Action dated Oct. 1, 2013", 8 pgs.

"U.S. Appl. No. 13/961,042, Notice of Allowance dated Mar. 12, 2014", 8 pgs.

"U.S. Appl. No. 13/961,042, Notice of Allowance dated Sep. 15, 2014", 5 pgs.

"U.S. Appl. No. 13/961,042, Response filed Jan. 8, 2014 to Non Final Office Action dated Oct. 1, 2013", 9 pgs.

"International Application Serial No. PCT/US2011/030744, International Search Report dated May 23, 2011", 3 pgs.

"International Application Serial No. PCT/US2011/030744, Preliminary Report on Patentability dated Oct, 11, 2012", 7 pgs.

"International Application Serial No. PCT/US2011/030744, Written Opinion dated May 23, 2011", 6 Pgs.

"Japanese Application Serial No. 2012-138603, Office Action dated Dec. 3, 2013", (w/ English Translation), 8 pgs.

"Japanese Application Serial No. 2012-138603, Response filed May 2, 2014 to Office Action dated Dec. 3, 2013", (w/ English Translation of Amended Claims), 7 pgs.

Corum, C. A., et al., "Signal Processing and Image Reconstruction for SWIFT", *Proceedings, 15th Scientific Meeting, International Society for Magnetic Resonance in Medicine*, (2007), p. 1669.

Idiyatullin, D., et al., "Fast and quiet MRI using a swept radiofrequency", *Journal of Magnetic Resonance*, 181(2). (Aug. 2006), 342-349.

Idiyatullin, D., et al., "Gapped Pulses for frequency-swept MRI", *Journal of Magnetic Resonance*, 193(2), (Aug. 2008), 267-273.

Moeller, S., et al., "Correction of RF pulse distortions, with application in radial imaging using SWIFT", *Proc. Int. Soc. Mag. Reson. Med.*, 16, (May 16, 2008), 229.

"Japanese Application Serial No. 2012-138603, Appeal and Amendment filed Feb. 27, 2015 in response to Examiners Decision of Rejection dated Oct. 28, 2014", (w/ English Translation of Amendment), 11 pgs.

"Japanese Application Serial No. 2012-138603, Examiners Decision of Rejection dated Oct. 28, 2014", (w/ English Translation), 8 pgs.

Baker, E. B., et al., "Time-Sharing Modulation at 200 kc Aplied to Broad and Narrow Line NMR for Base-Line Stability", The Review of Scientific Instruments, vol. 36, No. 10, (Oct. 1965), 1495-1498.

\* cited by examiner

SIDEBAND PROCESSING FOR MAGNETIC RESONANCE

U.S. CLAIM OF PRIORITY

This patent application claims the benefit of priority, under 35 U.S.C. Section 119(e), to Curtis A. Corum, U.S. Provisional Patent Application Ser. No. 61/499,015, entitled "SIDEBAND PROCESSING FOR MAGNETIC RESONANCE," filed on Jun. 20, 2011, which is hereby incorporated by reference herein in its entirety.

STATEMENT REGARDING FEDERALLY SPONSORED RESEARCH OR DEVELOPMENT

This invention was made with government support under award number 5P41RR008079, 5P30NS05791, and 1R21CA139688, from the National Institutes of Health. The government has certain rights in this invention.

BACKGROUND

SWIFT (Sweep Imaging with Fourier Transformation) refers to a fast, 3D radial magnetic resonance imaging sequence including nearly simultaneous excitation and acquisition of spin data. In one example, SWIFT includes a gapped RF pulse. SWIFT (an example of which is represented in FIG. 1) includes a chain of gapped HSn low flip angle excitation pulses (including frequency sweep "f") in the presence of a constant (per-view) readout gradient.

In one example of SWIFT, the HSN family of pulses are used for excitation. The RF-pulse can be defined using 32× oversampling. The gapping pattern is inserted into the pulse as blanking of the RF shape. The frequency response of the RF pulse depends on the gapping pattern for excitation. By way of examples, an RF duty cycle can be 12.5% (a baseband and a series of sidebands denoted as ±1, ±2, ±3, ±4, ±5, ±6, and ±7), 25% (a baseband and a series of sidebands denoted as ±1, ±2, and ±3), and 50% (a baseband and sidebands denoted as ±1).

An NMR signal is received in the gaps where the transmitter is gated off and the receiver gated on (doubly-gated). SWIFT has desirable features for a fast radial 3D sequence, including a high acquisition duty cycle, immunity to gradient integral errors, extremely short $T_2$ sensitivity, and very smooth gradient updates (quiet, low gradient hardware demand).

In SWIFT, k-space is sampled along a radial projection from the center (k=0) and extending outward. The time allocated to obtain each k-space point is almost constant for the entire k-space. In one example, SWIFT entails parallel imaging for radial acquisitions and includes suppressing streaking artifacts in an equivalent way to interpolation between spokes.

As shown, for example in FIGS. 12-17, an image is generated using SWIFT by sampling k-space. The k-space sampling for the acquired FOV is smaller than the spectral width. FIGS. 12-17 illustrate acquired data points and the gaps represent missing data points.

A sideband signal arising from a magnetic resonance imaging sequence can lead to artifacts and produce a degraded image. For example, the sidebands can contribute spectra which can overlap, or fold into, a main lobe, and thus lead to undesirable artifacts in the resulting image.

Baker, E. B., et al, in *Time-Sharing Modulation at 200 kc Applied to Broad and Narrow Line NMR for Base-Line Stability*, The Review Of Scientific Instruments, Volume 36, Number 10, pages 1495-1498, October 1965, refers to a time-sharing method of alternately pulsing an NMR transmitter and receiver to reduce base-line instability due to leakage signal. This paper refers to methods for increasing the repetition rates to 200 kc and higher, which displace the sidebands well away from the carrier, giving undistorted broad line absorption signals, and high resolution spectra without side band overlap (e.g., $^{19}F$ spectra). Some undesirable features associated with field and frequency modulation are thus avoided. The method entails using two pulsers, fast diode switches, and a broad band power amplifier.

Additional publications that may relate to the present subject matter include the following:

Idiyatullin, D.; Corum, C.; Park, J. Y. & Garwood, M., Fast and Quiet MRI Using a Swept Radiofrequency, *J Magn Reson*, 2006, 181, 342-349;

Idiyatullin, D.; Corum, C.; Moeller, S. & Garwood, M. Gapped Pulses for Frequency-Swept MRI, *J Magn Reson*, May 2008;

Andersen P M, Rosen M E, Erhard P, Adriany G, Strupp J P, Salmi R J, Ugurbil K *Over-sampling digital IF receiver for MRI* Proc of Int'l Soc of Magn Reson in Med, New York, N.Y. 1996

S. Moeller, C. Corum, D. Idiyatullin, R. Chamberlain, M. Garwood, ISMRM, Toronto 2008;

Curt Corum, Djaudat Idayatullin, Steen Moeller, and Mike Garwood. Doubly-Gated (Excitation and Acquisition) Effects in SWIFT, ISMRM Workshop on Data Sampling and Image Reconstruction, 2009;

Corum, C. A.; Idiyatullin, D.; Moeller, S. & Garwood, M. Signal Processing and Image Reconstruction for SWIFT, Proceedings 15th Scientific Meeting, International Society for Magnetic Resonance in Medicine, 2007, 1669;

PCT Pub. No. WO 2011/123657, entitled PULSE GAP CYCLING FOR IMPROVED SWIFT, International Application No. PCT/US2011/030744 Publication Date 06.10.2011, International Filing Date 31.03.2011, refers to a magnetic resonance image produced by shifting a gap during acquisition of spin data for a specimen. The spin data is generated by a gapped excitation sequence.

OVERVIEW

The doubly-gated transmit and receive schemes used with SWIFT gives rise to a number of properties to the signal processing and resulting artifacts. An example of the present subject matter relates to the effects of doubly gated (time-shared) transmit and receive time on the SWIFT signal.

The present subject matter includes methods for removing or utilizing a sideband signal in SWIFT or other related magnetic resonance technique.

An example of the present subject is directed to reducing artifacts when using SWIFT. To that end, the present subject matter allows use of training data to generate a larger field of view than would be available without encoding. In addition, the present subject matter provides a solution to discard data outside the field of view, and thus avoid folding such data into the field of view or creating an artifact. As such, one example can generate information that represents a combination of removal of folding artifacts and displaying a sharper image in a larger field of view.

The present inventors have recognized, among other things, that square wave modulated excitation produces artifacts that impair magnetic resonance image quality. The present subject matter can help provide a solution to this problem, such as by extracting signal content from the sidebands that result from square wave modulated excitation and using the content to remove artifacts.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In SWIFT, the fast switching between transmit and receive limits the maximum bandwidth, and by extension the resolution that can be achieved in a reasonable time.

One example of the present subject matter is directed at a method to acquire undersampled k-space in a radial direction with SWIFT and use multi-channel arrays to correct for the undersampled k-space coverage, thereby enabling higher resolution within the same scan times.

Figure 1:
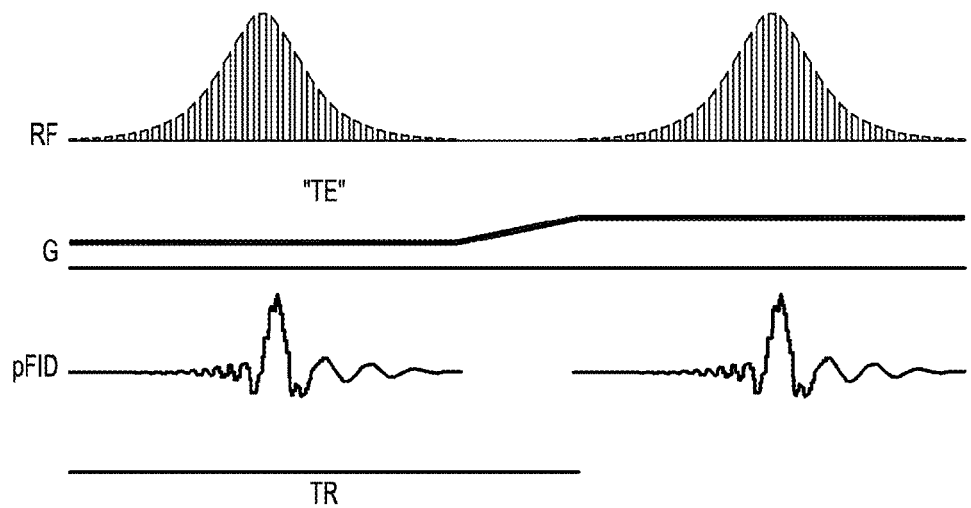
FIG. 1 illustrates a simplified SWIFT sequence showing two pulses and acquisitions.

FIG. 1 illustrates a representation of a SWIFT sequence. The data in the figure represents time domain signals. The RF signal and the f signal, in the example shown, represent a swept frequency signal having square wave modulation. The swept frequency, in this example, is described as an HSn family signal. The gaps produced by the square wave modulation are discontinuities that give rise to sidebands. The gradient signal is non-zero and continuous for the period shown. The pFID signal represents a response corresponding to a pseudo-FID (free induction decay) signal. The pFID signals correspond to the swept frequency excitation and in one instance, a time period denoted as TR is indicated.

Figure 2:
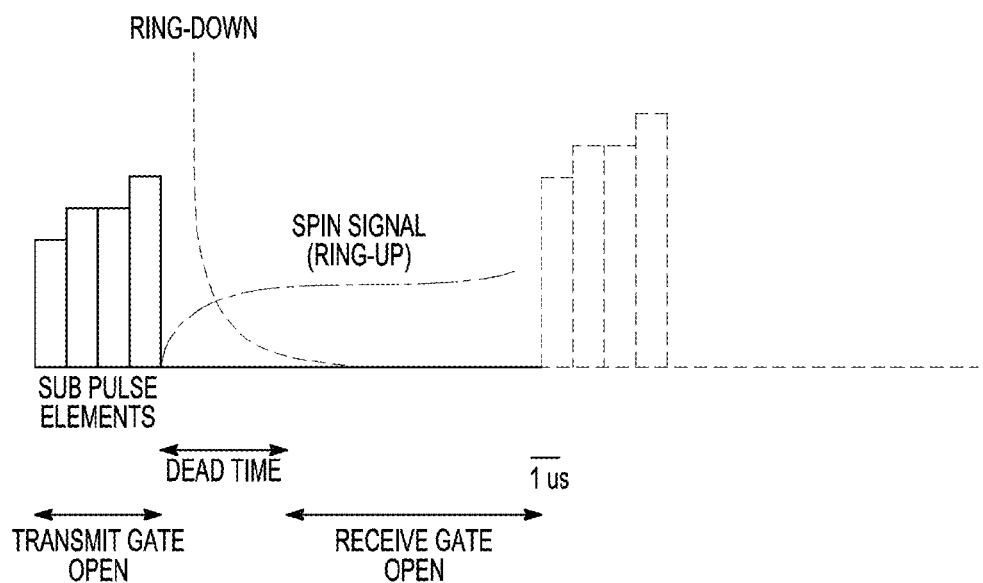
FIG. 2 illustrates a subinterval of a SWIFT sequence showing oversampled transmitted pulse and position of transmit and receive gate openings, according to one example.

FIG. 2 illustrates a subinterval of a SWIFT sequence showing oversampled transmitted pulse and the relative position of transmit and receive gate openings, according to one example. The discontinuities in the SWIFT sequence generate sidebands that can include signal content.

Part 1

The following portion describes receiver sideband unoverlapping.

In SWIFT, transmitter gating can cause sidebands in the transmitted pulse. The sidebands can exceed the baseband bandwidth. The resulting sidebands can excite undesired signal outside of the SWIFT field of view (FOV). Even if all the spin isochromats resonances are within the baseband bandwidth, the sidebands cause off-resonance nutation of the spins, thus creating an observable signal.

Figure 3A:
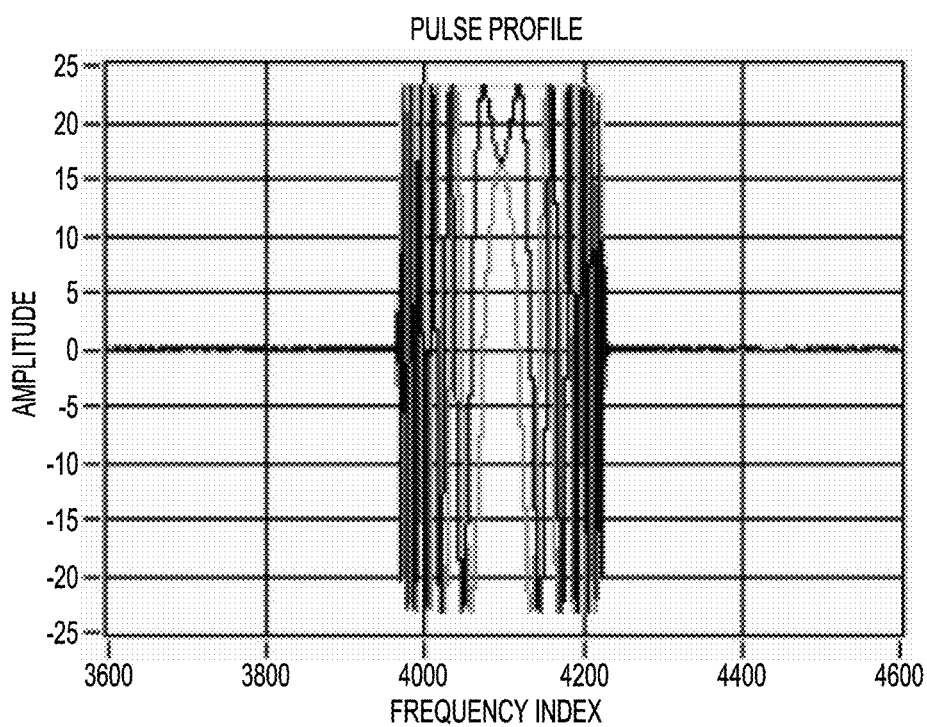
FIG. 3A illustrates a complex frequency profile of ungapped HS1 pulse.
Figure 3B:
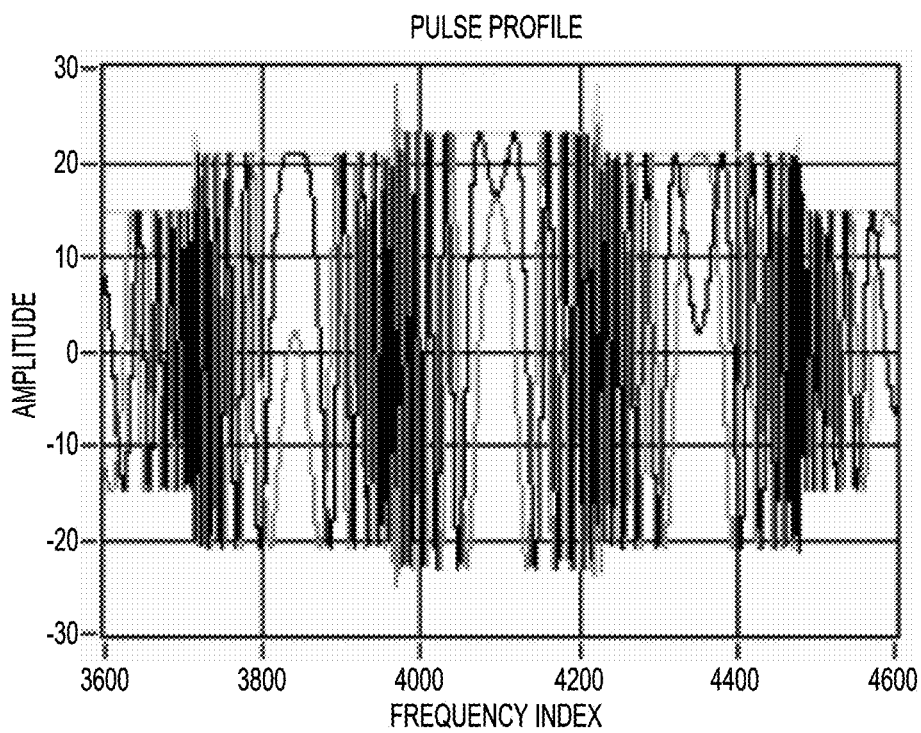
FIG. 3B illustrates a complex profile of gapped HS1 pulse.

FIG. 3A illustrates a frequency profile of an HS1 pulse and which is free of discontinuities. FIG. 3B illustrates a gapped HS1 pulse. In this example, the duty cycle of the transmitter is 25%. The −1 and the +1 sidebands are nearly the same amplitude as the baseband.

In addition to sidebands arising from excitation by the transmitter, the receiver gating also serves to chop the RF spin signal before A-D (analog to digital) conversion. The chopping creates modulation sidebands of the ungated signal.

The tail portions of the modulation sidebands may overlap the baseband. In a baseband sampled analog receiver (non-oversampled), some of the out of baseband signal will alias into (or fold into) the baseband. In a digital receiver, even when using a brick-wall filter, the sideband tails can contaminate the baseband.

Since the baseband signal is contaminated, artifacts are produced in the final image. In addition, the image can include haze which impairs contrast and reduces measured signal to noise ratio (SNR).

To eliminate or correct contamination of the baseband, one approach is to eliminate the folded signal using gap cycling. Gap cycling uses a cycle of different gap locations in the transmitter and receiver relative to the pulse. This produces received data which, when combined, has no modulation or pulse sideband effects. Since most of the imaginary off-resonance spin component is slowly varying in the frequency domain, it is unnecessary to cycle each view, so no additional acquisitions are required.

One example of the present subject matter entails using oversampled data (such as might be available with a particular console or with add-on hardware). Contamination can be corrected with a post-processing algorithm. One example corrects contamination without using oversampled data. Oversampled resampling can remove some of the contamination (gridding with oversampling).

Pseudo Inverse

The forward operation effect of receiver gating on the spin signal (frequency domain) can be represented as a matrix or convolution kernel. In this representation, the spin signal is represented as $D(f)$ and the folding kernel is represented as $K(f)$. A convolution operation yields, $D(f)*K(f)=D'(f)$. The matrix representation can be stated as $\underline{K}\vec{D}=\vec{D}'$ where $\underline{K}$ as circulant matrix or toeplitz matrix form. This approach addresses edge treatment as to Gibbs ringing.

The effects of $\underline{K}$ may be solved for cases of interest as pseudo inverse or other matrix solver. The pseudo inverse of $\underline{K}$ can be written as $\underline{K}\#$ where $\underline{K}\ \underline{K}\ \#\approx\underline{I}$ where $\underline{I}$ is the identity matrix.

It can be shown that $D'(t)*K(t)^{\#}\approx\hat{D}(t)$ wherein $K(t)^{\#}$ is approximately circulant and the caret over $D(t)$ indicates that this is an estimate.

In matrix form, this is expressed as $[K^{\#}]\dagger\vec{D}'=\hat{\vec{D}}$ in which dagger † denotes a conjugate transpose of the matrix (or Hermitian conjugate or transjugate). The recovered estimate for D can then be used to produce a SWIFT image with reduced artifact and haze.

Sideband Utilization

Content in the sideband can be used to excite the field of view. Signal content in the tails can provide image information.

Sidebands are among the consequences of using interrupted excitation (such as with SWIFT). By cycling the interruptions (or gaps), the result includes inverted sidebands and, when viewed over a large number of cycles, the sidebands cancel out.

With receiver gating, the folded sidebands yield contamination of the main lobe.

Consider a matrix representation in which D represents data without transmitter gating and without receiver gating, D' represents data with transmitter gating only, and D" represents data with receiver gating only.

In this representation, MD=D" or, D=M$^{-1}$D" in which M$^{-1}$ is deemed a pseudo inverse. The product of the pseudo inverse and the receiver gating representation yields clean data.

In this representation, M represents a model that takes into consideration the simulation model. Alternatively, M can be interpreted as multichannel interpolation estimated based on training data. For a generalized inverse, M is based on a model or M can be based on calibration from multiple channels.

If it is considered that M is based on a calibration, then this can be applied in the time domain either before or after correlation of the data or this can be applied in the frequency domain. Matrix M can represent calibration done with a larger field of view.

Stated differently, acquiring low resolution, over sampled, data in the time domain can be used to get a value for M.

Consider a case in which M as based on calibration, thus, the low resolution data yields a large field of view which can capture objects outside of a larger spectral bandwidth.

According to one example, an objective is to resort to an expression that can be solved using linear mathematics. In this case, the measured data (sensed) can be expressed as matrix S(t), and E can be used as an approximate representation for M, and g(t) can represent the object. Stated differently, this becomes S(t) E=g(t). If S(t) is a matrix of dimensions 1×N (where N is the number of measurements) and g(t) includes a pixels, then the number of measurements is N*α. An overdetermined system can use a fewer number of pixels, namely α'<α, so, N*α' will yield satisfactory results.

Matrix g(t) can be described as sparse in one domain.

Part 2

The following portion describes sideband processing.

SWIFT (SWeep Imaging with Fourier Transform) is an NMR and MRI sequence. SWIFT nearly simultaneously excites and receives signals in the gaps of a gapped frequency swept (or amplitude modulated) pulse, as shown in FIGS. 1 and 2.

Transmitter Gating

In accordance with one example of SWIFT, the transmitter gate is opened and closed to transmit the gapped pulse, and the receiver gate is opened and closed to allow signal reception during the gaps. As a result, both the transmitted pulse and the received data have modulation sidebands.

Figure 4A:
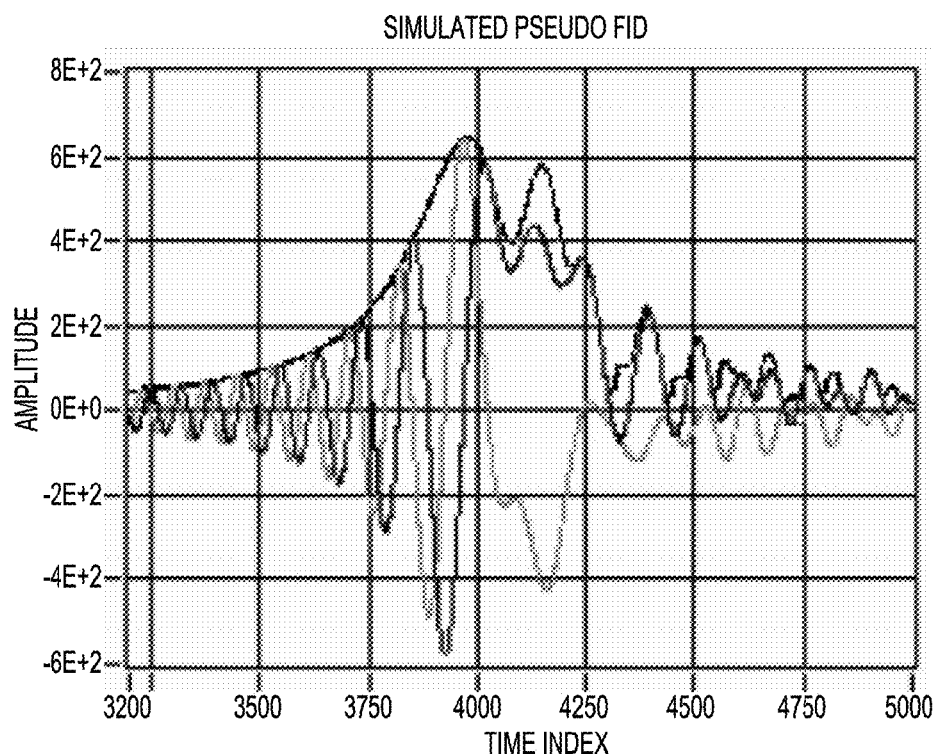
FIG. 4A illustrates a time domain spin signal from ungapped HS1 excitation.
Figure 4B:
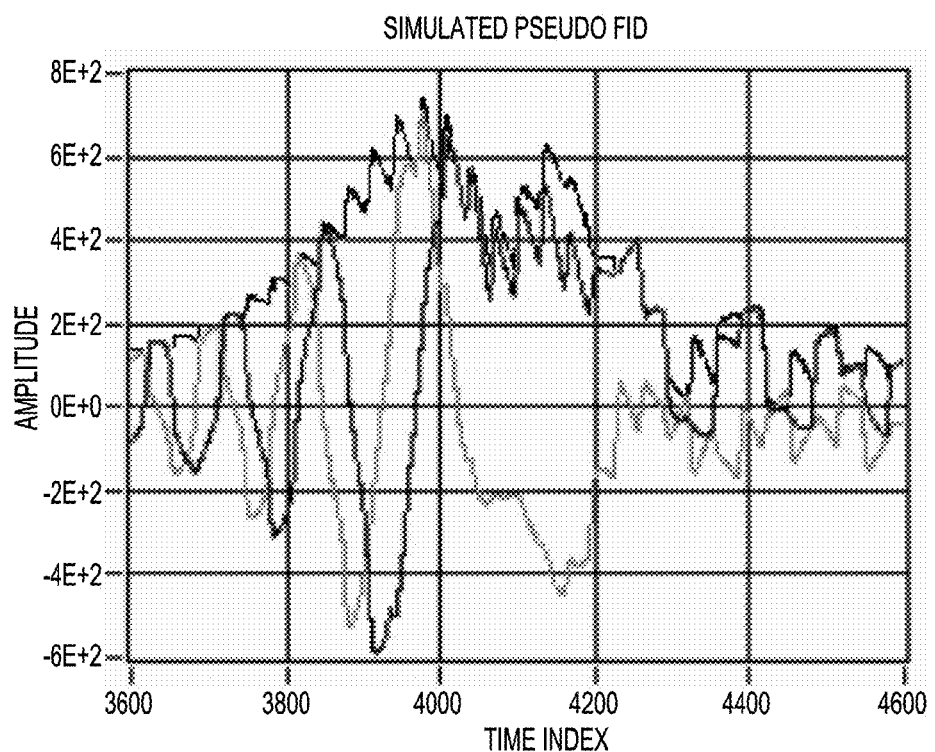
FIG. 4B illustrates a time domain spin signal from gapped HS1 excitation.

In SWIFT, the transmit gating causes sidebands in the transmitted pulse, as shown in FIGS. 3A-3B. The sidebands can excite undesired signal outside the baseband field of view. Even if all spin resonances are within the bandwidth of the baseband, the sidebands cause off-resonance nutation of the spins, creating observable content out of the baseband signal. FIGS. 4A and 4B exhibit "tails" of the spectrum excited by the gapped pulses. The time domain views shown in the figures have a jagged appearance as a consequence of the "start-stop" of RF power, which leads to high frequency components.

Receiver Gating

Figure 5A:
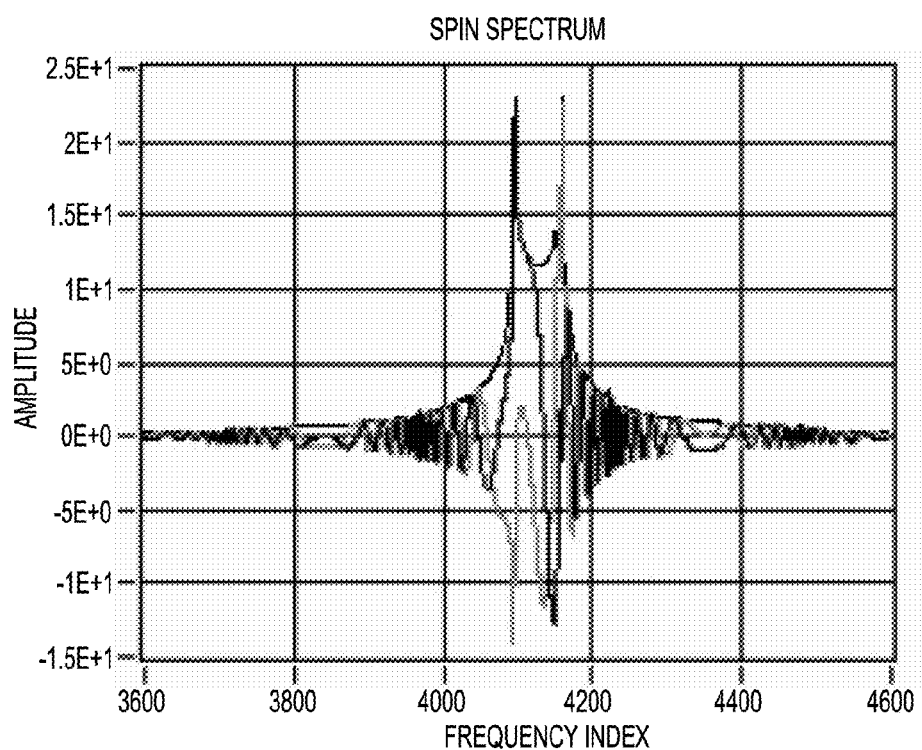
FIG. 5A illustrates a spin spectrum showing the long, off-resonance tails excited by HS1 pulse sidebands.
Figure 5B:
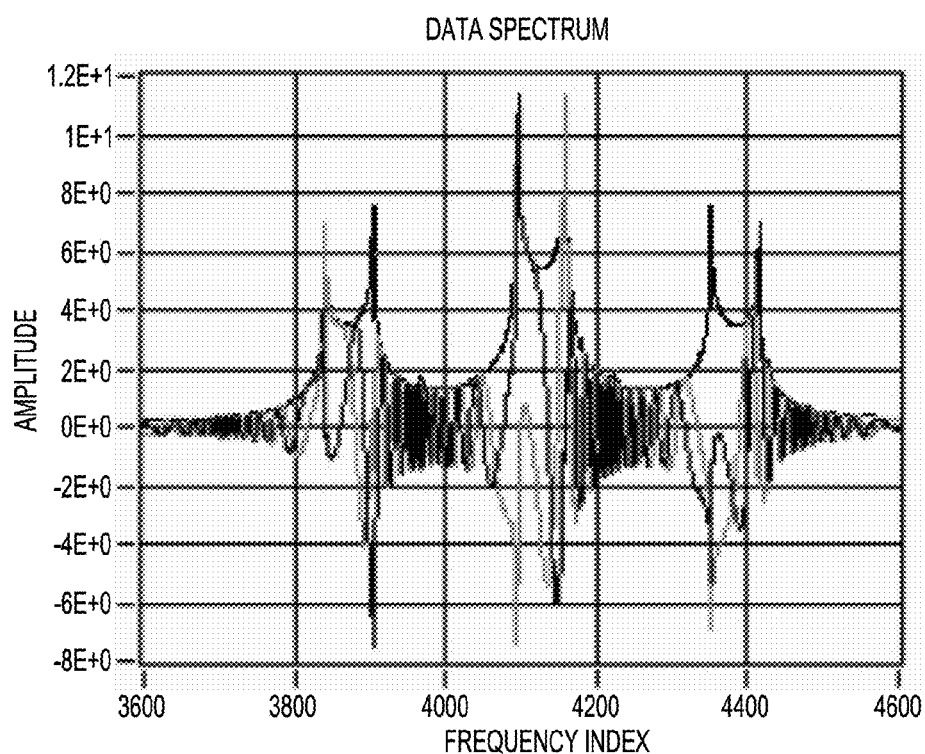
FIG. 5B illustrates a data spectrum shown after chopping by the receiver gate. The figure illustrates modulation "replicas" of the spin spectrum. The tails of the replicas overlap the baseband (see FIG. 5C).
Figure 5C:
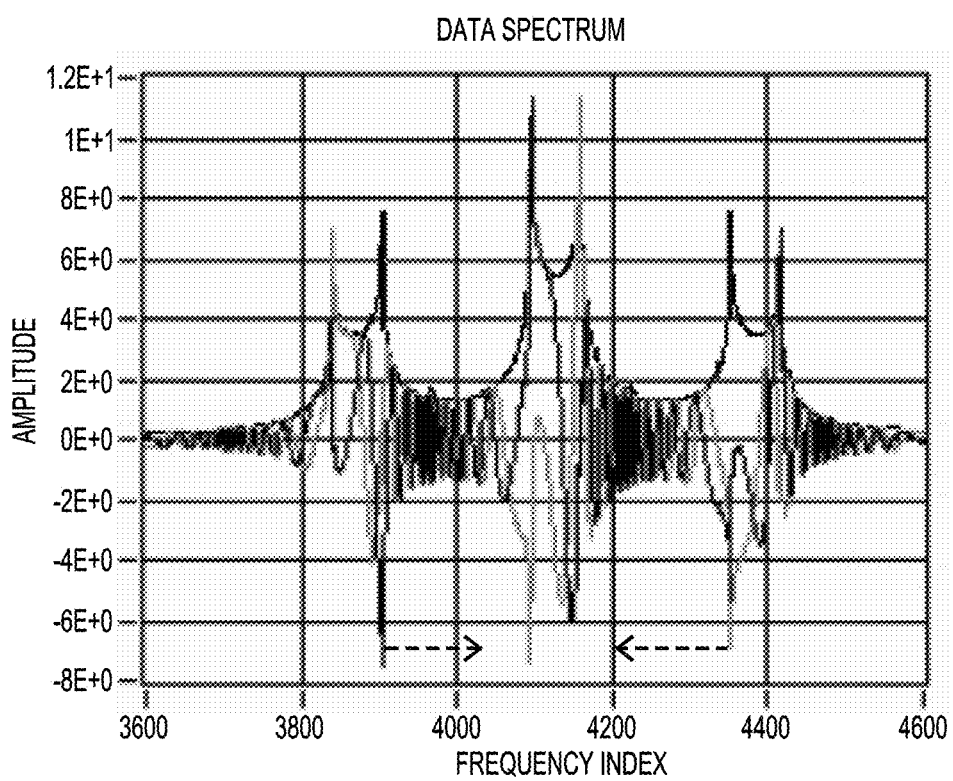
FIG. 5C illustrates tails from the receiver gating sidebands overlapping the baseband, thus contaminating the baseband with unwanted signal.

In addition to the transmitter gating, the receive gating also chops the RF signal before analog-to-digital (ADC) conversion. The chopping creates modulation sidebands of the un-gated signal, as shown in FIGS. 5A, 5B, and 5C. The tails of the receiver gate modulation sidebands overlap the baseband. In a digital receiver with brick-wall digital filtering, the sidebands tails will still contaminate the baseband due to the combination of transmit and receive gating modulation.

In a baseband sampled analog receiver, the signal outside the baseband can fold in (or alias) as well. This can include both the baseband spin spectrum tails and the receiver gate modulation sidebands.

Baseband (or Inter-band) Contamination

Since the baseband signal is contaminated, artifacts are produced in the final reconstructed image. This includes contrast-destroying "haze" which also contributes to a reduced SNR.

An example of the present subject matter is configured to eliminate or correct the contamination of the baseband. As noted above, one approach to eliminate the folded signal can be viewed as gap cycling. Gap cycling uses a cycle of different gap locations in the transmitted pulse (which also cycles the receiver gate position) to produce data which, on average, after a full cycle (at least 4 for 25% transmit duty cycle) has no sidebands. The combined data is equivalent to the data obtained from an un-gapped pulse (and un-gated receiver).

In one example, the sideband artifact can be corrected using oversampled time domain data. Oversampled data enables post-processing via a pseudo inverse.

Figure 6:
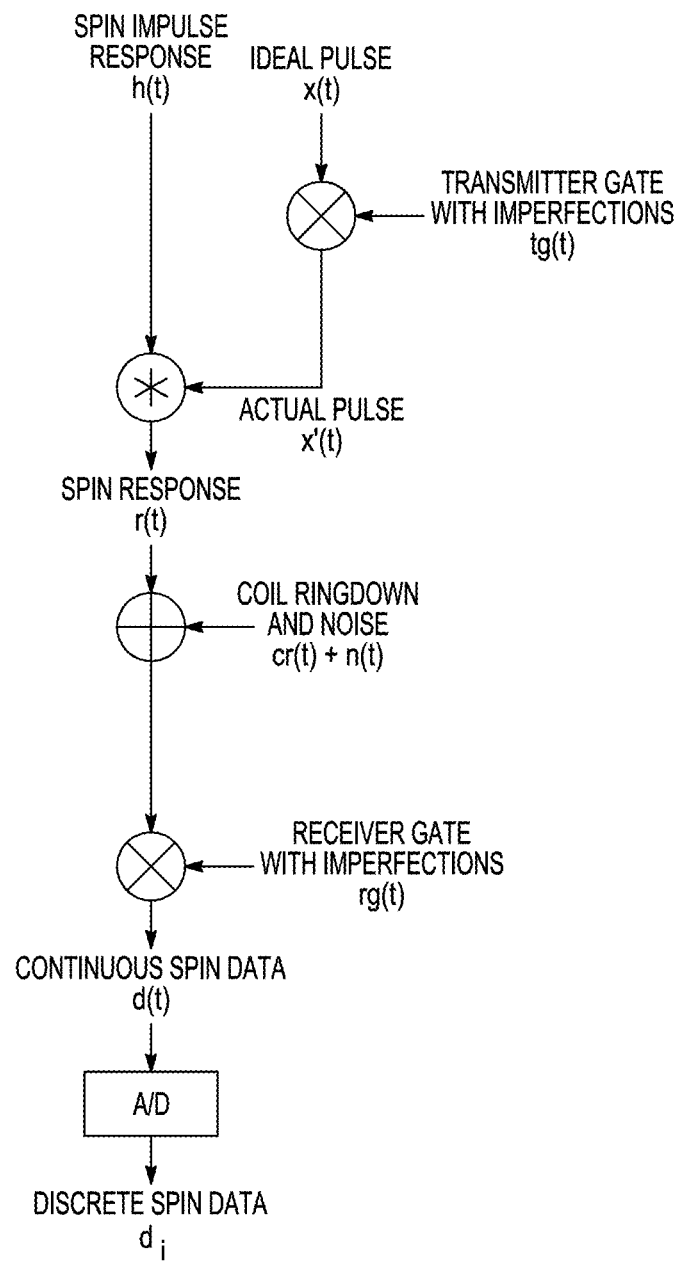
FIG. 6 illustrates a SWIFT forward signal flow diagram.

FIG. 6 summarizes the forward modulation of the signal due to transmit and receive gating. Expressed in the time domain, this entails a convolution of the spin impulse response h(t), and the RF pulse x(t) (assumed to be ideal, in the figure), to find the system (spin) response r(t). Mathematically, this is h(t)*x(t)=r(t). In FIG. 6, additional inputs to the calculation of discrete spin data are shown to include the include transmit gate errors, coil ringdown and noise, and receiver gate errors. In the figure, A/D denotes and analog to digital conversion process.

Pseudo Inverse

Figure 7A:
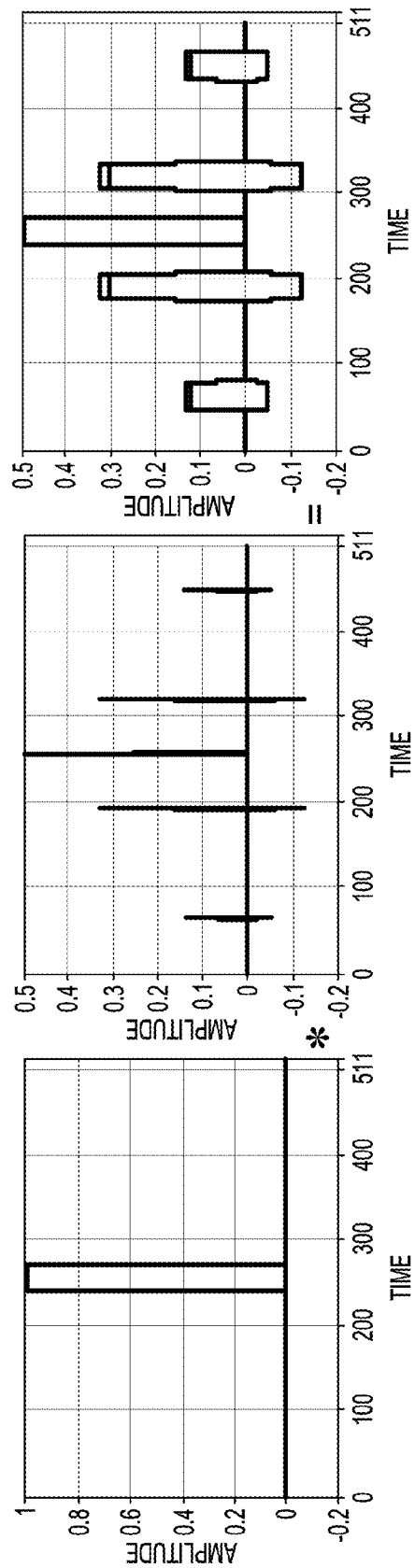
FIG. 7A illustrates receiver gating (chopping) can be represented by convolution with a "folding kernel" in the frequency domain. This operation can be represented by matrix multiplication.
Figure 7B:
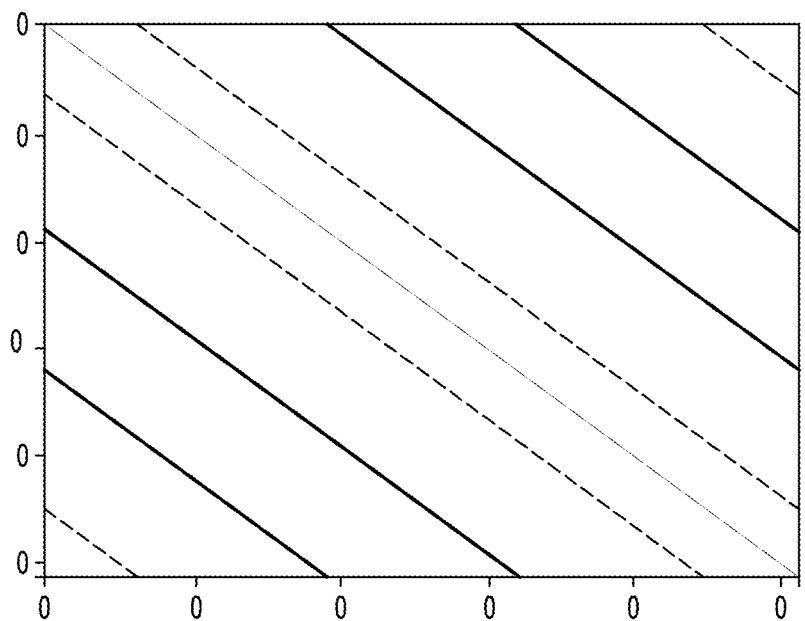
FIG. 7B illustrates an equivalent "folding matrix" to the kernel (magnitude of complex shown).

The forward operator effect of receiver gating on the spin signal (in the frequency domain) can be represented as a matrix, or for the middle of the spectrum, as a convolution kernel, as shown at FIG. 7A and FIG. 7B.

FIG. 7A illustrates receiver gating (chopping) can be represented by convolution with a "folding kernel" (as shown in FIG. 7B) in the frequency domain. This operation can also be represented by matrix multiplication.

Figure 8A:
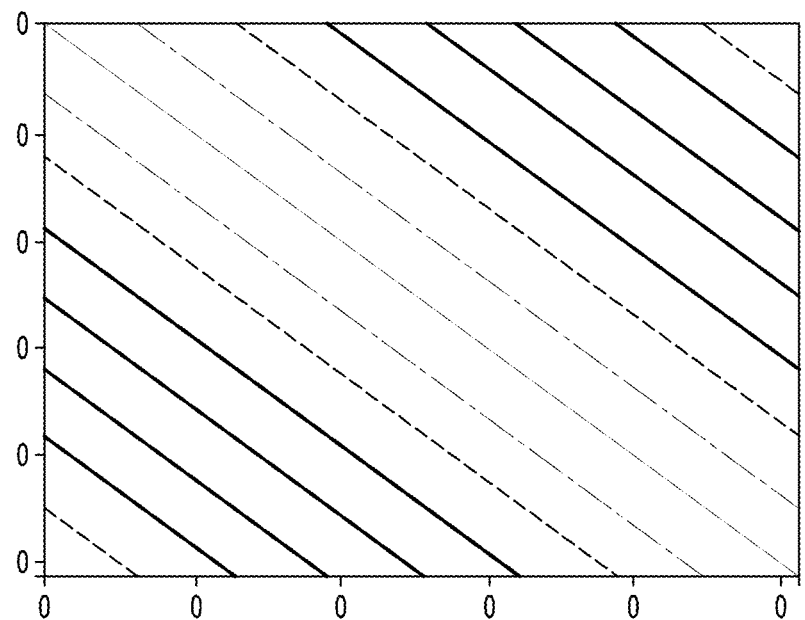
FIG. 8A illustrates a magnitude of the pseudo inverse "unoverlapping" matrix.
Figure 8B:
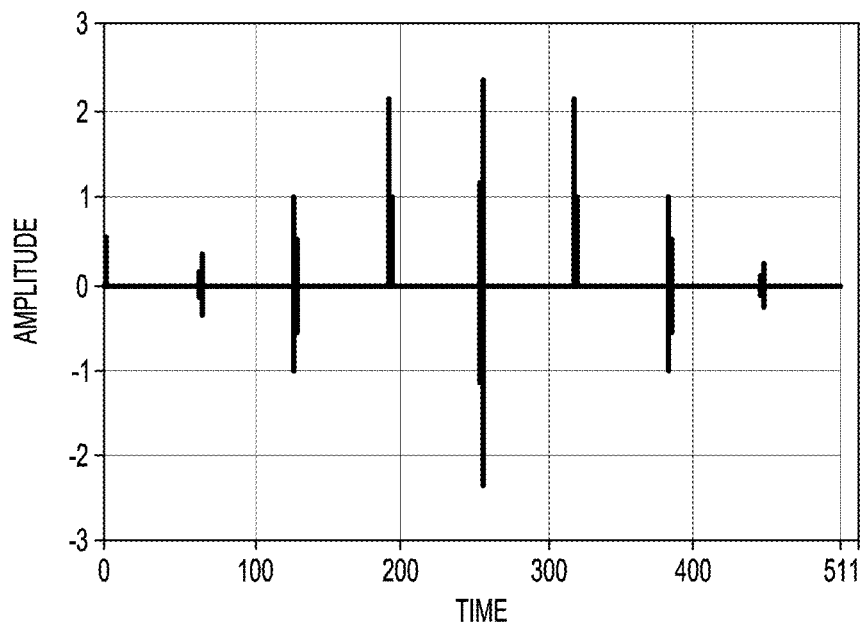
FIG. 8B illustrates an unoverlapping kernel corresponding to the middle column of the (pseudo inverse) unfolding matrix.
Figure 8C:
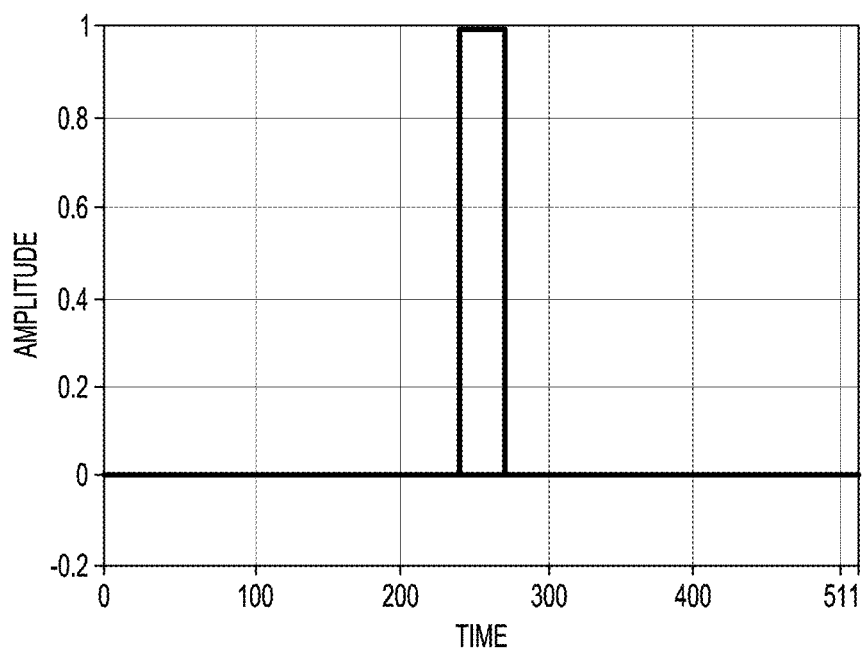
FIG. 8C illustrates recovered baseband signal with receive gate sidebands.

The pseudo inverse may be solved numerically for cases of interest, as shown in FIGS. 8A-8C. Multiplication by the pseudo inverse matrix, as shown in FIG. 8A removes the effects of the receive gating. In one example, the effect can be removed by a convolution provided that the far sidebands are not desired to be cleaned up.

The recovered data, uncontaminated by receive sidebands, can then be brick-wall filtered and used to produce a SWIFT image with reduced artifacts and haze.

Figure 9:
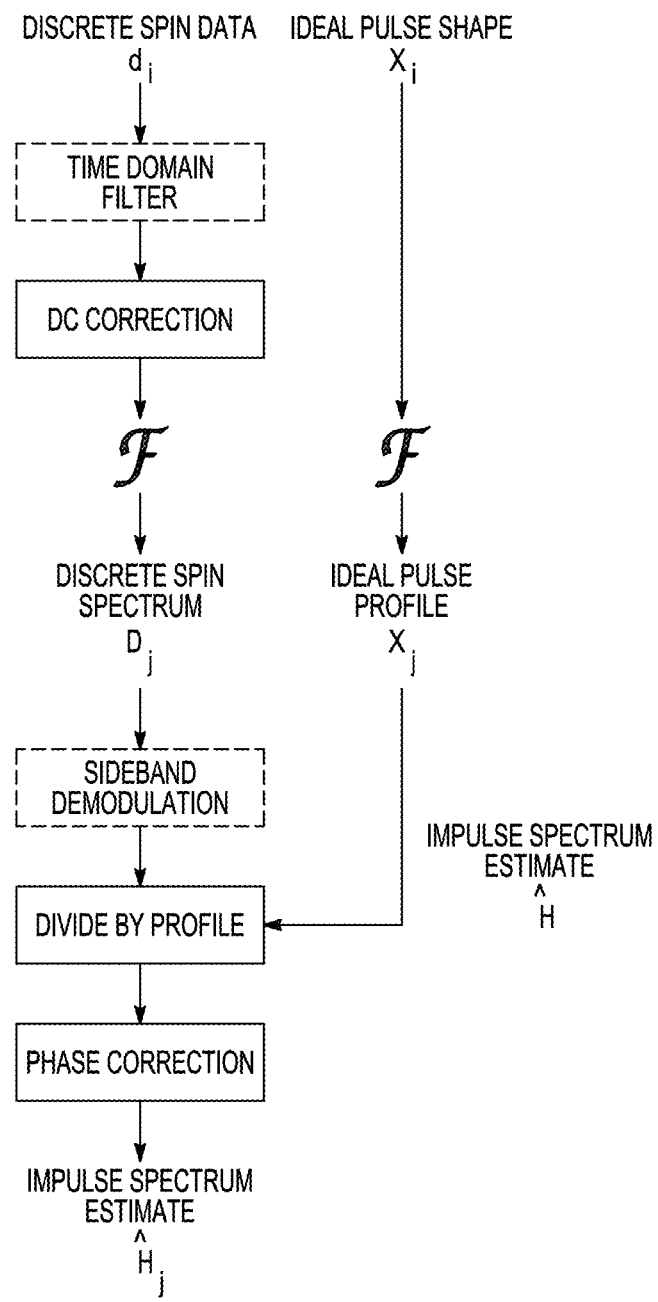
FIG. 9 illustrates a SWIFT signal processing flow diagram.

FIG. 9 illustrates a summary of signal processing to isolate the uncontaminated signal bands available in SWIFT with oversampled time domain data.

In FIG. 9, the boxes with dotted outlines represent oversampled data. In addition, selecting the baseband entails un-overlapping. This illustration is similar to the inverse of the forward signal flow diagram presented earlier.

Resampling and Gridding

In the absence of oversampled time domain data, a re-sampling strategy can be used to generate (interpolate) oversampled time domain data. This can be accomplished as part of oversampled gridding reconstruction. In addition to the re-sampling along the direction of the k-space acquisition, 3D gridding also mixes information from nearby acquisition data (views) which may provide further interpolated temporal resolution.

In SWIFT, image reconstruction can include oversampled gridding with a Kaiser-Bessel kernel and grid after sample density correction.

Figure 10:
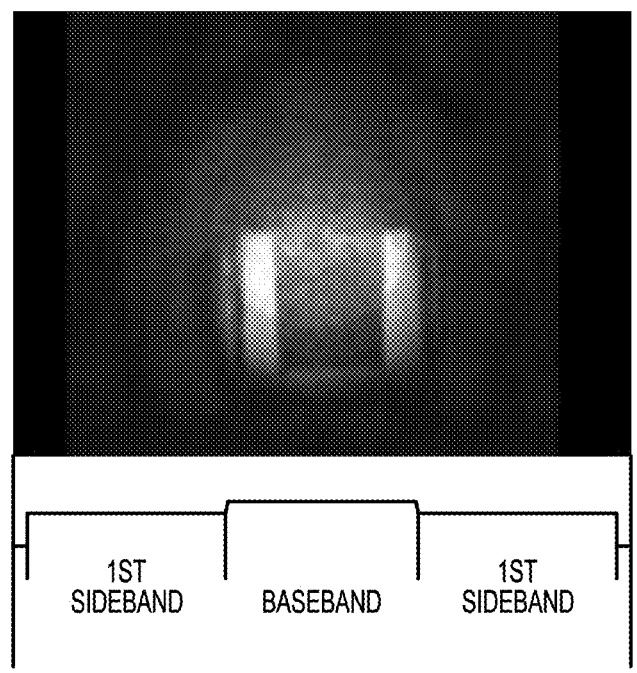
FIG. 10 illustrates an image showing phantom data utilizing the baseband and adjacent sidebands.

In the example shown in FIG. 10, oversampled gridding alone can be used to reconstruct an image using baseband and sidebands. Signal that has been modulated into the incorrect band by chopping is dispersed as artificial noise while signal in the correct band can be reconstructed. In addition, since the sidebands signal is also restored, an increased bandwidth signal corresponding to baseband plus one or more sidebands (or partial) can be used. FIG. 10 illustrates an image showing phantom data utilizing the baseband and adjacent sidebands. In this example, the excitation profile of the gapped HS1 pulse has duty cycle equal to 0.33. FIG. 10 illustrates a ±1 sideband and in other examples, ±2 or ±n sidebands are also used.

Combined Oversampling and Re-sampling

In one example, a combination of oversampling and re-sampling gridding is used to eliminate or reduce a sideband artifact.

Part 3

The following portion describes signal processing and image reconstruction for SWIFT.

Consider next the effects of doubly gated (time-shared) transmit and receive time on the SWIFT signal, and the consequences for signal processing and image reconstruction of 3D radial SWIFT datasets.

Introduction

As noted, SWIFT can include a chain of gapped, hyperbolic secant family "HSn" low flip angle excitation pulses (including frequency sweep "f") in the presence of a constant (per-view) readout gradient. NMR signal is received in the gaps where the transmitter is gated off and the receiver gated on (doubly-gated).

Due to the extremely short dead time, SWIFT has excellent sensitivity to ultra-short $T_2$ and $T_2^*$ spins.

Effects of an RF Pulse

The impulse response of spin isochromat, when excited by an infinitely narrow hard pulse or delta function, can be expressed as a product $I_{ss}$ (which accounts for any steady state ($T_1$) effects) and an exponential function which accounts for the fact that the spin isochromat was unexcited before the delta function pulse. The exponent accounts for off-resonance and $T_2$ relaxation effects.

The spin response can also be expressed in the frequency domain using a Lorentzian function or in a form for the complex spectrum of a $T_2$ broadened line which includes the Re (absorption) and Im (dispersion) signal.

Imaging data can be expressed as a continuum of isochromats, (such as with a cubic water phantom in the presence of a gradient) and ignoring relaxation during the data acquisition period, this can be expressed in the frequency domain.

In the linear response region (which can be quite large with an FM pulse) the effect of a pulse on a continuum of spin isochromats can be expressed as a convolution operation using the response, the pulse, and the spin system impulse response. The relationship can be written in the Fourier domain by the convolution theorem as R(f)=WH(f where R(f) is the product of the pulse profile X(f), and H(f) is the spin spectrum. This result is general (for all NMR and MRI excitation pulses) in the small flip angle regime, and is the basis of Fourier pulse design. For offset independent adiabatic (OIA) pulses, the result also holds true with perhaps some improvement.

Correlation

The phase due to the FM excitation pulse can be removed by correlation. Correlation is not usually considered an integral part of NMR (sometimes uses reference deconvolution) or MRI signal processing. Most MRI and many NMR sequences use hard or amplitude modulated (AM) pulses, which do not distort the phase of the frequency domain data (other than $0^{th}$ and $1^{st}$ order phase correction). Most AM pulses for imaging (e.g. slice or slab selective sinc pulses) have a flat excitation profile, so further flattening of the profile is not required.

SWIFT does not acquire an echo, but instead acquires what can be considered a "pseudo-FID" (pFID). SWIFT can include using correlation to remove the "quadratic-like" phase to obtain an FID, analogous to that obtained with AM pulse excitation. The effects of the pulse are removed from the time or frequency domain data. The inverse operation to convolution is correlation. If the data is correlated with the pulse, the effects of the pulse are removed from the data, leaving the spin impulse response which can be mathematically expressed in the time domain using an estimate of the spin spectrum.

In the frequency domain, the pulse correlation operation entails division by the pulse profile.

OIA Effects

The basis of the profile robustness of HS1(f) (and other orders of HS pulses) originates from the "offset independence" condition of the OIA pulse. In an OIA pulse, the profile is flat all the way to the high flip angle (adiabatic) limit, and holds at low flip angles. In linear designed AM pulses a "dip" tends to develop in the part of the profile corresponding to the on-resonance spins (the center of the profile for symmetric pulses). Because OIA pulses induce nearly identical spin trajectories for spins within the band, the profile remains flat.

Calculating Phase from Sum of Projections (Auto-phasing)

Delays from pulse and receiver timings as well as coil tuning and cable lengths can cause variation in the zero and the first order phase of SWIFT data. Because SWIFT data is gridded as FID projections, the phase should be consistent between projections. Image artifacts can result from incorrect phasing and are not easily correctable after image reconstruction.

Automatic phase estimation from the data itself is one solution to phase variations. Phase can be estimated based on the properties of the absorption and dispersion line shapes in the frequency (spectral) domain. Far from the line center the absorption signal falls off as $1/f^2$ while the dispersion signal falls off as $1/f$. For this reason, the phase of the complex spectrum (projection) can be expected to approach positive or negative imaginary at a distance far from the line center.

Since the data in SWIFT are 3d->1d projections, which are ideally averages over a planar slice of an extended object, there can be some difficulty to the calculation. The object itself can have structure as well as multiple chemical species. In addition at higher fields, there can be phase effects due to B1 propagation, and spatially dependent B0 variations. Also, there can be distortions of the true projection baseline due to ring-down and gating effects and sideband overlap.

Consider a superposition of Lorentzian lines located at various positions along a given frequency encoding gradient. In addition, there may be a spatially dependent phase (due to B1 effects). Furthermore, there may be multiple chemical species (such as fat and water) at each position. In addition, there is a net absorption.

An example of the present subject matter includes an automated algorithm for estimating the zero and the first order phase from a set of projections based on the above argument.

Short Dead Time and Short $T_2$ Sensitivity.

SWIFT has a short effective dead time imaging sequence. BLAST (or RUFIS) are sequences with comparable dead time, but each has peak power requirements that limit flip angle with clinical-sized coils. A practical limit of gapped SWIFT dead time is the coil ring-down time. UTE sequences have very short dead time as well.

An example of SWIFT can extend the range of practical short $T_2$ (and $T_2^*$) imaging beyond that of UTE type sequences.

Double Gating

In addition to correlation, there are other unique properties to SWIFT. In most MRI sequences (and most NMR sequences) there is a distinct continuous acquisition interval. The receiver gate opens and A/D conversion commences. It is possible to have multiple acquisitions per excitation (such as in RARE or other multi-echo sequences), but in general they are not concerned with maintaining phase coherence (they are handled in magnitude mode or have their timing corrected).

The transmitter and receiver gates are nearly complementary, allowing for a short "dead time" for opening and closing of the gates, as well as coil ring-down. Because the transmitter gate is opened and closed to transmit the gapped pulse, and the receiver gate is opened and closed to allow reception in the gaps, both the transmitted pulse and the received data produce modulation sidebands.

Gated excitation and acquisition is seen with homodecoupling experiments.

Transmitter Gating

The pulse is first "gapped" by the transmitter gate. This has consequences for the pulse fidelity and profile. Providing gaps in a pulse creates sidebands in the profile as well as reducing the flip angle in the baseband. If the gating is periodic, and it happens at a short enough period, there will be no overlap of transmit sidebands with the baseband. The transmit profile of the pulse baseband is unaffected, except for reduced amplitude. This constraint is met by SWIFT, under ideal hardware conditions. In addition the flatness of the baseband depends on the time domain "oversampling" of the transmitted pulse.

In SWIFT, transmit gating yields sidebands in the transmitted pulse.

Receiver Gating

SWIFT uses a "gated" or "gapped" acquisition interval. The acquisition interval is broken up into segments where the receiver gate is "open" allowing the spin signal to be digitized as well as intervals where it is "closed" to protect the hardware from the large signal from the pulse. The spin signal remains present, but is swamped by the much larger signal from the pulse.

Gate Stability and Modulation

The timing demands of SWIFT impose good performance requirements in T/R switching units, internal gate timing, and preamp recovery of MRI hardware. For example, experimental data shows that T/R switching hardware behaves differently at very short dead times (~2-4 µs or shorter) relative to the much longer dead times in fast gradient echo or UTE sequences. SWIFT operates with a short dead time and has a high switching rate so that transients in the T/R switches, pre-amps, digital or analog filters, and other gating and control signals do not have time to decay (or ring-down).

Instability and transients in the transmit gate may result in errors in the transmitted pulse. In addition, the combination of receive switch and pre-amplifier have transient level and gain. The combination of transmit and receive switch and coil ringdown and preamp level and gain transients may appear as a baseline error in NMR spectroscopy. In SWIFT, the effects of the gate transients are not limited to the start of the FID but are spread throughout.

Baseband (or Inter-band) Contamination

Since the baseband signal is contaminated, artifacts are produced in the final reconstructed image. This can include contrast-destroying "haze" which also contributes to reduced SNR.

FIG. 9 summarizes a signal flow diagram and FIG. 8 summarizes the forward modulation experienced by the signal due to transmit and receive gating.

Pulse Gap Cycling

In one example, it is desirable to eliminate or correct the contamination of the baseband. One approach entails using a cycle of different gap locations in the transmitted pulse (which also cycles the receiver gate position) to produce data which, on average after a full cycle (at least 4 for 25% transmit duty cycle), has no sidebands. The combined data may be equivalent to the data obtained from an un-gapped pulse (and un-gated receiver). In practice there may be some transient signal, but gap cycling also smoothes these transients leading to reduced contamination.

Pulse gap cycling is described in U.S. patent application Ser. No. 12/752,668, PULSE GAP CYCLING FOR IMPROVED SWIFT, filed Apr. 1, 2010, which is incorporated herein by reference.

Demodulation

The forward operator effect of receiver gating on the spin signal (frequency domain) can be represented as a matrix, or for the middle of the spectrum, as a convolution kernel.

The pseudo inverse may be solved numerically for cases of interest. Multiplication by the pseudo inverse matrix can remove the effects of the receive gating. In one example, the effects can be removed as a convolution if the far sidebands are not desired to be cleaned up.

The recovered data uncontaminated by receive sidebands can then be brick-wall filtered and used to produce a SWIFT image with reduced artifacts and haze.

Part 4

The following portion describes 3D radial parallel imaging for bandwidth-limited acquisitions.

With SWIFT, the FOV is larger than the object being imaged. Also, with SWIFT, the gradients are always on and smoothly varying from projection to projection. Typically, the maximum gradient-strength is not utilized, since the FOV has to be big, and thus slew-rates are not of concern. For high resolution imaging, this implies that the SWIFT pulse has to be lengthened, which both increases acquisition time and reduces the sensitivity due to $T_2^*$ and $T_2$ SNR loss during the lengthened readout. To achieve higher spatial resolution while maintaining short scan time and high sensitivity, parallel imaging can be used.

For a radial sequence, multi-channel reconstruction with either CG-SENSE (Sensitivity Encoding) or GRAPPA (Generalized Autocalibrating Partially Parallel Acquisitions) can be used to effectively fill in k-space for missing projections. This can reduce radial streaking in the image point spread function (PSF) or, conversely, extend the Nyquist sampled radius, which does not significantly increase the resolution. Radial reconstruction performed using CG-SENSE is more computationally intense than that performed using GRAPPA.

To increase the spatial resolution, the FOV can be selected to be aliased, while maintaining broadband excitation of the object. Each projection can be unaliased with a GRAPPA interpolation kernel. In the gapped pulse, due to presence of sidebands, the excitation bandwidth is much larger than the FOV, and for reduction factors of to 3, for example, the $1^{st}$ RF sidebands can be used for excitation.

Methods

A breast phantom composed of water and fat, with an embedded spherical glass-vial can be imaged in a quad transmit 2-channel receive breast coil. A fat suppressed SWIFT sequence can be used with 256 gaps per projection, a total of 24576 projections, with a CHESS fat-suppression pulse and spoiling once every 16 views. Two acquisitions with an FOV of 25 cm and 12.5 cm, respectively, can be obtained, with otherwise identical parameters. An azimuthally independent 1×4 GRAPPA interpolation kernel can be calibrated from the 25 cm acquisition and thereafter applied to the 12.5 cm FOV acquisition. After interpolation with the GRAPPA kernel, each channel can be constructed with gridding, and a root-sum-of-squares (RSOS) combination can be performed.

Results and Discussion

Figure 11A:
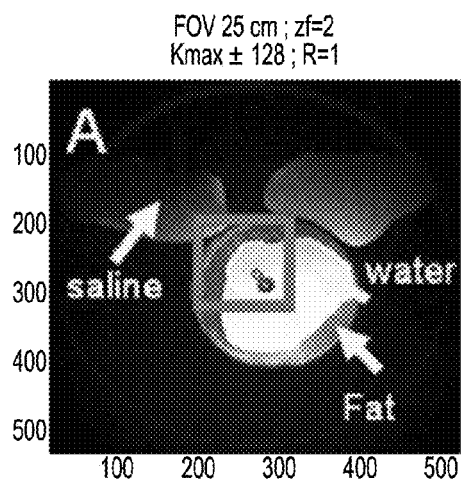
FIGS. 11A, 11B, 11C, and 11D illustrate a selected slice of 3D SWIFT images.
Figure 11B:
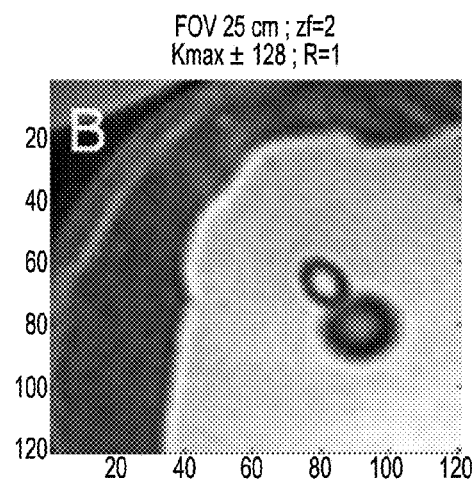
Figure 11C:
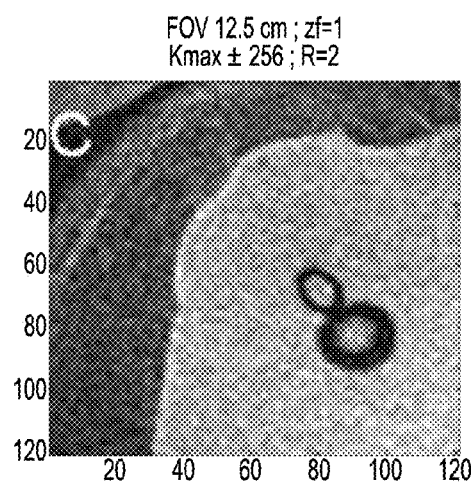
Figure 11D:
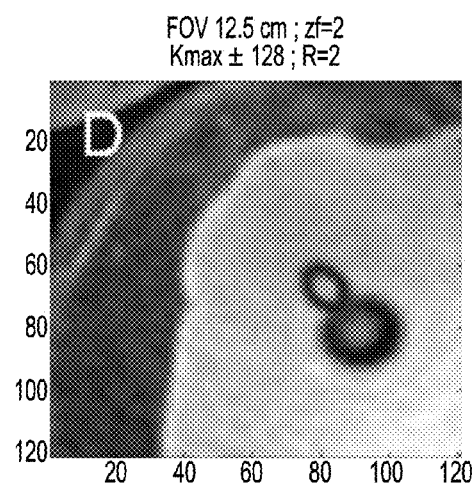

FIGS. 11A, 11B, 11C, and 11D illustrate a selected slice of 3D SWIFT images with a resolution of 0.5×0.5×0.5 mm³ in which FIG. 11A depicts a full FOV with 2× zero filling; FIG. 11B depicts zoom of box region in shown in FIG. 11A; FIG. 11C depicts R=2 reconstruction of aliased FID's with 128 points; and FIG. 11D depicts R=2 reconstruction of aliased FID's with 64 points and with 2× zero filling after reconstruction.

The full FOV SWIFT image (un-accelerated, 2-fold zero-filled, RSOS reconstruction) is shown in FIG. 11A, with a zoomed region displayed in FIG. 11B. FIG. 11C shows the higher resolution image achievable with an identical acquisition but acquired with half the FOV and reconstructed with GRAPPA (R=2). The effective volume element is ⅛ the size of that in the full FOV image, and a higher noise level is seen. Truncating the reconstructed FIDs to the same extent as in the full FOV acquisition is shown in FIG. 11D. Comparable noise-level and resolution with the un-accelerated acquisition is noticed. The effective acquisition time would be 50% less than the full acquisition, and with acceptable performance for the ROI shown.

Conclusion

Readout parallel imaging reconstruction can be applied to 3D radial imaging with the SWIFT sequence. The benefits are significant for the SWIFT sequence, since the FOV previously had to be bigger than the object. The method can be demonstrated for a 2-channel reconstruction, with an acceleration factor of 2.

An interpolation operator can be a GRAPPA kernel. The operator can be calibrated as a unique kernel for each k-space point $(\theta,\varphi)$, calibrated as a kernel for a neighborhood around $(\theta,\varphi)$ (using, for example, N=2, 10, or 30 projections), or calibrated as a single kernel independent of $(\theta,\varphi)$. In one example, the interpolation is along axis k(r) using four sampled points.

Grappa kernel calibration (or training) can take the form of (synthesized skipped data)=GRAPPA(synthesized undersampled data).

Using the synthesized under-sampled data, the relation can be solved for the GRAPPA function. With the calculated GRAPPA function, the following relation can be used to calculate or determine missing data:

(missing data)=GRAPPA(measured undersampled data)

Note, that an angular dependent kernel is suitable when the object fills the FOV.

Figure 12:
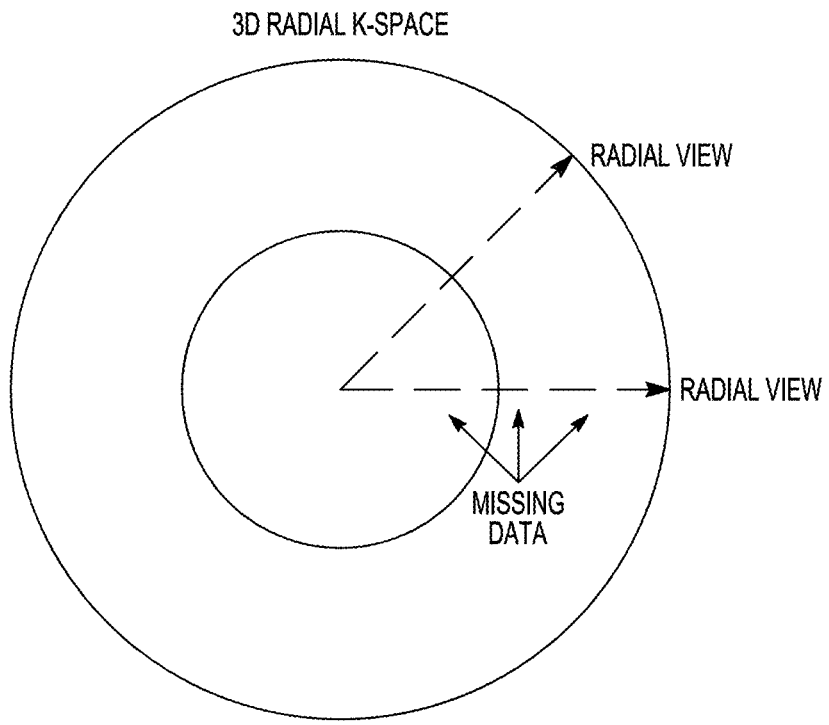
FIG. 12 illustrates an example of missing data caused by receiver gapping in SWIFT.
Figure 13:
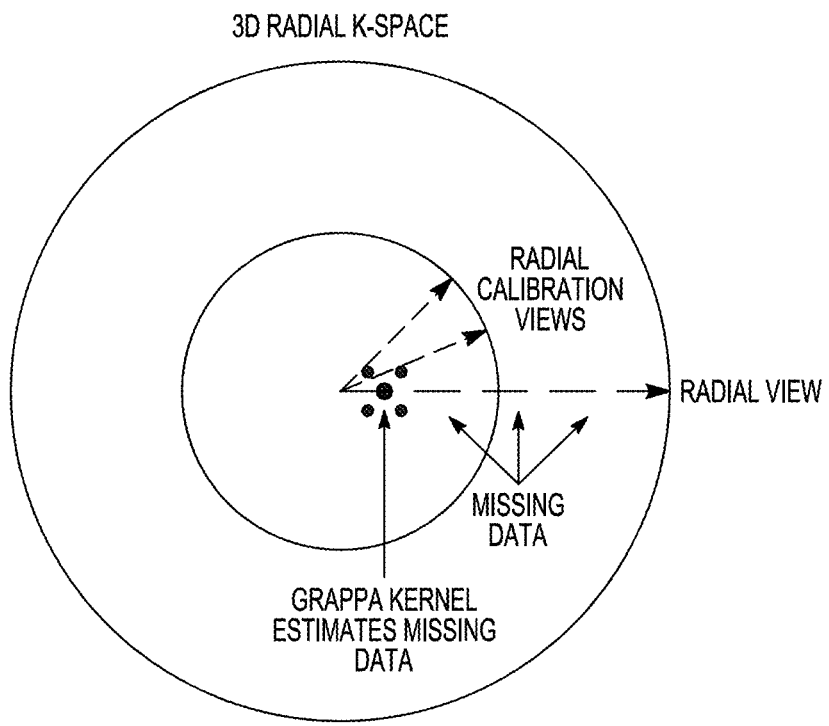
FIG. 13 illustrates an example of a GRAPPA kernel calculated from a large field of view calibration dataset.

SWIFT can be described as having gaps in the time domain k-space data (after pre-processing with correlation with the pulse shape). In FIG. 12, the gaps appear between the line segments associated with projections denoted here as radial views.

A calibration dataset (or training dataset) with a larger field of view, and otherwise similar parameters, can be used to acquire data missing from the full resolution dataset.

From the calibration dataset a non-Cartesian GRAPPA kernel or Cartesian GRAPPA kernel can be calculated that allows the full resolution dataset to be reconstructed. In FIG.

13, a GRAPPA kernel is generated using the radial calibration dataset represented by two radial calibration views. The GRAPPA kernel is then used to interpolate the missing data in the radial view.

Figure 14:
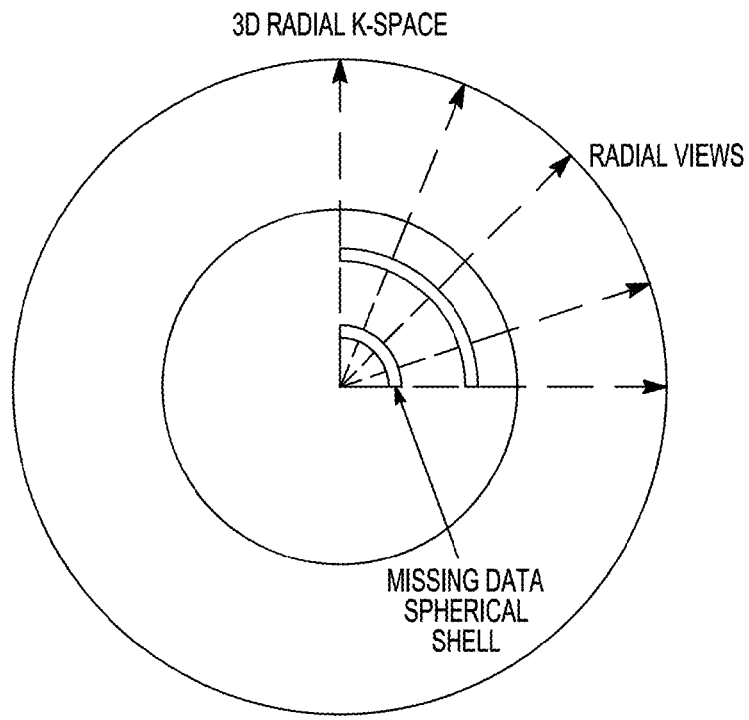
FIG. 14 illustrates an example of missing data in a SWIFT dataset.

The missing data in a SWIFT dataset (for a fixed FOV and sampling bandwidth) is associated with a missing arc of information. Increasing the number of radial views does not cure the missing data. FIG. 14 illustrates a SWIFT dataset having a pair of arcs associated with missing data.

Pulse gap cycling can be used to change the position of the missing data in one projection relative to another projection. Cycling of the pulse gap can supply the missing data and improve image resolution.

Figure 15:
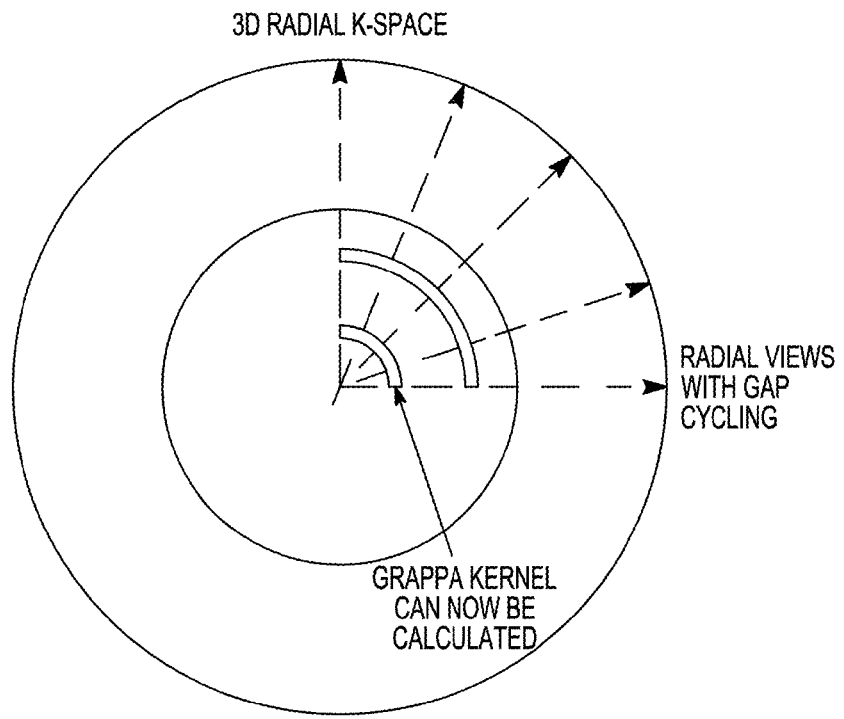
FIG. 15 illustrates gap cycling near the center of k-space to facilitate calculation of a GRAPPA kernel.

In one example, a GRAPPA kernel can be estimated near the center of k-space and without a separate training dataset. FIG. 15 illustrates a SWIFT dataset with gap cycling near the center of k-space and used to calculate a GRAPPA kernel.

Oversampling in the time domain can yield multiple data points within the receiver gate open portion of the received data stream. This translates into a potentially larger field of view for the final image. In practice, this allows folded projection information to be excluded from the final image.

Figure 16:
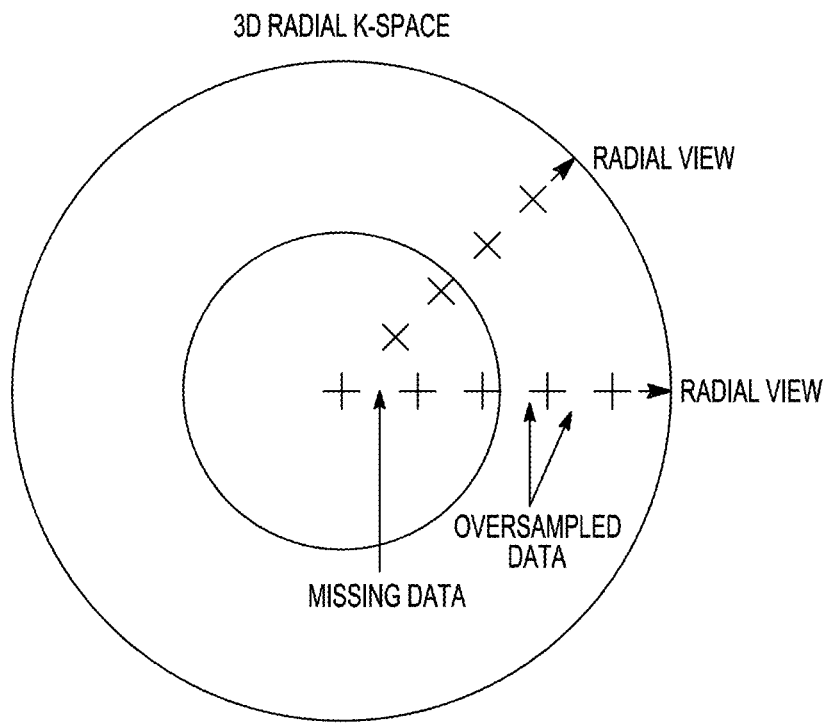
FIG. 16 illustrates projections having missing data and oversampling.

Radial gaps in the k-space data with spherical symmetry can give rise to the potential for folding artifacts, even at large view numbers and with oversampling. The radial gaps correspond to missing data that could be used to reconstruct signal excited by sidebands of the transmitted pulse. As shown in FIG. 16, oversampling can be used to generate data for the projections. Oversampling yields finer spaced k-space data and can be used to encode a larger FOV. Receiver gap position yields spherically symmetric shells of missing data, which can lead to a folded projection signal and artifacts in the final image.

Gap cycling can be combined with oversampling to evenly cover the central region of k-space and encode low spatial frequency information in proper position. The net effect is to reduce folding artifacts or encode sideband-excited signal in the correct position in the final image.

Figure 17:
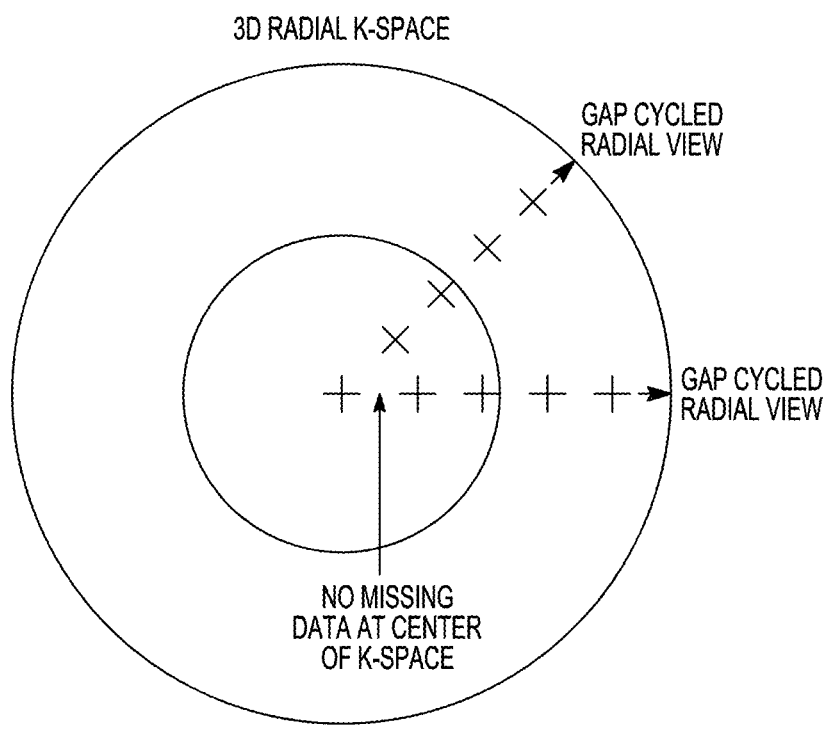
FIG. 17 illustrates gap cycling combined with oversampled data.

A GRAPPA kernel can also be calculated and used to fill in data at outer k-space positions. As shown in FIG. 17, gap cycling combined with data oversampling can be used to fill in the central region of k-space.

VARIOUS NOTES & EXAMPLES

Sideband tail overlap can be corrected in one example. Since the original time domain data r(t) before reception is not band limited, the reception process in SWIFT introduces overlap of the sideband tails into the baseband. Autophasing partially compensates for the residual baseband.

An example of the present subject matter can be implemented using a pulse train having at least one discontinuity or gap in time. An example of the present subject matter can be implemented using a gated receiver.

In addition to magnetic resonance imaging and spectroscopy, the present subject matter can also be used for electron paramagnetic resonance (EPR) or electron spin resonance (ESR).

An example of the present subject matter is directed to utilizing the signal content found in the sidebands of the system response. The sideband signal content can be processed to improve image quality. In one example, the sideband signal content can be utilized to improve image quality by using the sideband to excite the FOV. This can be used to increase the bandwidth and correct image artifacts.

Some of the examples of the present subject matter described herein include processing of the +1 sideband and the −1 sideband (referred to as ±1 sideband), however, any number of sidebands can be used. The sidebands are in successive positions adjacent the baseband.

In one example, sideband processing entails oversampling the data in the time domain. Oversampled data can be processed using a pseudo inverse matrix. In addition, oversampling includes some combination of pre-gridding, post-gridding or both pre-gridding and post-gridding.

In one example, sideband processing entails gap cycling. By modulating a series of gaps in data, the gaps are shifted in a manner that allows interpolation of data in order to provide a improved image quality.

In one example, sideband processing entails a combination of oversampling and gap cycling.

In one example, sideband processing entails an interpolation operator (or a convolution operator). An interpolation operator, sometimes referred to as a kernel, can be used to fill-in missing data. For example, training data can be used to determine a GRAPPA-type kernel (sometimes used for unfolding) which thereafter can be utilized to fill in missing data. The training data (or calibration data) can be selected using a variety of methods. In addition to a GRAPPA kernel, other types of interpolation operators can be used. For example, a kernel can be determined based on a guess, based on prior data, or based on other factors. Furthermore, the kernel can be specific to a particular data set, to a particular projection, or per a period of time or space.

In one example, a method includes acquiring low resolution image data. The low resolution data serves as the training or calibration data for determining a GRAPPA kernel. The method also includes acquiring gapped high resolution image data. The GRAPPA kernel derived from the training data can be used to generate missing data for the high resolution data.

In various examples, an interpolation operator can be combined with a gap cycling or oversampling.

RF fraction refers to a parameter associated with a duty cycle after the time of the excitation pulse. The value following the label denotes a measure of a fraction of time relative to the acquisition interval. For example, with RF fraction 0.5, the receiver gate remains continuously on during half the time following cycling of the receiver gate.

Suitable weighting (for example, a multiplier) can be applied to either the data (and the interpolation kernel is determined by the training or calibration data) or the data is unweighted (and the kernel is appropriately weighted based) on the RF fraction.

In the views shown in FIGS. 12-17, the inner circle corresponds to 0.5 and the outer circle corresponds to 1.0.

The SWIFT imaging technology described herein entails gapped pulses for excitation. The gapped pulses gives rise to sidebands. In addition to SWIFT, other imaging technologies also use gapped pulses. Another example of a pulse train suitable for use with the present subject matter includes DANTE, an acronym based on delay alternating with nutation for tailored excitation.

Examples of the present subject matter can be applied to achieve a particular outcome in imaging. For example, the useful bandwidth can be increased, thus allowing for imaging of objects having short T2 time. In addition, the present subject matter is more power efficient and thus, allows imaging using reduced power levels. Furthermore, the present subject matter allows for more rapid imaging.

Example 1 can include or use subject matter such as a system comprising a data receiver and a processor. The data receiver is configured to receive magnetic resonance data. The magnetic resonance data results from excitation by a baseband and sidebands from a modulated RF pulse. The processor is coupled to the data receiver. The processor is configured to execute an algorithm to generate an image of the object based on the magnetic resonance data. The image corresponds to baseband excited data and sideband excited data.

Example 2 can include, or can optionally be combined with the subject matter of Example 1, to optionally include wherein the magnetic resonance data includes oversampled data and wherein the algorithm is configured to perform a matrix calculation.

Example 3 can include, or can optionally be combined with the subject matter of one or any combination of Examples 1 or 2 to optionally include wherein the matrix calculation includes multiplication with a pseudo-inverse matrix.

Example 4 can include, or can optionally be combined with the subject matter of one or any combination of Examples 1 through 3 to optionally include wherein the algorithm is configured to determine an interpolation operator based on the magnetic resonance data.

Example 5 can include, or can optionally be combined with the subject matter of Example 4 wherein the algorithm is configured to generate the image based on the interpolation operator.

Example 6 can include, or can optionally be combined with the subject matter of one or any combination of Examples 1 through 5 to optionally include wherein the data receiver is configured to receive pulse gap cycled data and wherein the algorithm is configured to generate the image based on the pulse gap cycled data.

Example 7 can include or use subject matter such as a method. The method can include applying a pulse train to a spin system in a scanner. The pulse train can have a plurality of discontinuities in a time domain. The method includes receiving a response from the spin system. The response includes baseband content and sideband content. The method includes generating a correction factor based on the baseband content and the sideband content. The method includes calculating a correction to the response based on the correction factor. The method includes generating an image based on the correction.

Example 8 can include, or can optionally be combined with the subject matter of Example 7, to optionally include wherein generating the correction factor includes processing oversampled data corresponding to the response.

Example 9 can include, or can optionally be combined with the subject matter of one or any combination of Examples 7 or 8 to optionally include wherein generating the correction factor includes calculating an interpolation operator corresponding to the response.

Example 10 can include, or can optionally be combined with the subject matter of one or any combination of Examples 7 through 9 to optionally include wherein generating the correction factor includes processing a first response and processing a second response wherein the first response is time shifted relative to the second response.

Example 11 can include, or can optionally be combined with the subject matter of one or any combination of Examples 7 through 10 to optionally include wherein generating the correction factor includes generating an interpolation operator.

Example 12 can include, or can optionally be combined with the subject matter of one or any combination of Examples 7 through 11 to optionally include wherein generating the interpolation operator includes generating a GRAPPA kernel.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method comprising:
 applying a pulse train to a spin system in a scanner, the pulse train having a plurality of discontinuities in a time domain;
 receiving a plurality of responses from the spin system, each response of the plurality of responses including baseband content and sideband content;
 generating a correction factor based on the baseband content and the sideband content, wherein generating the correction factor includes processing a first response of the plurality of responses and processing a second response of the plurality of responses wherein a gate position of a transmitter and a receiver for the first response is time shifted relative to the gate position of the transmitter and receiver for the second response;
 calculating a correction based on the correction factor; and
 generating an image based on the correction.

2. The method of claim 1 wherein generating the correction factor includes processing oversampled data corresponding to the plurality of responses.

3. The method of claim 1 wherein generating the correction factor includes calculating an interpolation operator corresponding to the plurality of responses.

4. The method of claim 1 wherein generating the correction factor includes generating an interpolation operator.

5. The method of claim 4 wherein generating the interpolation operator includes generating a GRAPPA kernel.

\* \* \* \* \*

UNITED STATES PATENT AND TRADEMARK OFFICE
CERTIFICATE OF CORRECTION

PATENT NO. : 9,880,243 B2
APPLICATION NO. : 13/527283
DATED : January 30, 2018
INVENTOR(S) : Corum et al.

Page 1 of 1

It is certified that error appears in the above-identified patent and that said Letters Patent is hereby corrected as shown below:

On the Title Page

On page 2, in Column 2, item (56), under "Other Publications", Line 34, delete "Aplied" and insert --Applied-- therefor In the Specification In Column 1, Lines 16-19, delete "This invention was made with government support under award number 5P41RR008079, 5P30NS05791, and 1R21CA139688, from the National Institutes of Health. The government has certain rights in this invention." and insert --This invention was made with government support under CA139688, NS057091 and RR008079 awarded by National Institutes of Health. The government has certain rights in the invention.-- therefor In Column 5, Line 22, delete "as" and insert --has-- therefor In Column 8, Line 45, delete "R(f)=WH(f" and insert --R(f)=X(f)H(f)-- therefor In Column 14, Line 62, delete "T2" and insert --$T_2$-- therefor Signed and Sealed this
Eighteenth Day of June, 2019

Andrei Iancu
*Director of the United States Patent and Trademark Office*